(12) United States Patent
Kawanami

(10) Patent No.: US 10,790,112 B2
(45) Date of Patent: Sep. 29, 2020

(54) FOCUSED ION BEAM APPARATUS

(71) Applicant: HITACHI HIGH-TECH SCIENCE CORPORATION, Minato-ku, Tokyo (JP)

(72) Inventor: Yoshimi Kawanami, Tokyo (JP)

(73) Assignee: HITACHI HIGH-TECH SCIENCE CORPORATION (JP)

( * ) Notice: Subject to any disclaimer, the term of this patent is extended or adjusted under 35 U.S.C. 154(b) by 61 days.

(21) Appl. No.: 15/895,492

(22) Filed: Feb. 13, 2018

(65) Prior Publication Data

US 2018/0233319 A1 Aug. 16, 2018

(30) Foreign Application Priority Data

Feb. 15, 2017 (JP) .................. 2017-026264

(51) Int. Cl.
*H01J 37/147* (2006.01)
*H01J 37/08* (2006.01)
*H01J 37/09* (2006.01)
*H01J 37/10* (2006.01)
*H01J 37/20* (2006.01)
*H01J 37/244* (2006.01)
*H01J 37/28* (2006.01)

(52) U.S. Cl.
CPC .............. *H01J 37/08* (2013.01); *H01J 37/09* (2013.01); *H01J 37/10* (2013.01); *H01J 37/1471* (2013.01); *H01J 37/1474* (2013.01); *H01J 37/1478* (2013.01); *H01J 37/20* (2013.01); *H01J 37/244* (2013.01); *H01J 37/28* (2013.01); *H01J 2237/0455* (2013.01); *H01J 2237/0807* (2013.01); *H01J 2237/2448* (2013.01); *H01J 2237/24528* (2013.01); *H01J 2237/24542* (2013.01)

(58) Field of Classification Search
CPC .. H01J 37/08; H01J 37/09; H01J 37/10; H01J 37/1474; H01J 37/20; H01J 37/233; H01J 37/28; H01J 2237/0455; H01J 2237/0807; H01J 2237/2448

See application file for complete search history.

(56) References Cited

U.S. PATENT DOCUMENTS

| | | | | |
|---|---|---|---|---|
| 2008/0283778 A1* | 11/2008 | Tomimatsu | ........... | H01J 37/045 250/492.21 |
| 2009/0173888 A1* | 7/2009 | Shichi | ..................... | H01J 27/26 250/397 |
| 2012/0217391 A1* | 8/2012 | Shichi | ..................... | H01J 27/26 250/306 |

FOREIGN PATENT DOCUMENTS

| | | |
|---|---|---|
| JP | 7240165 | 12/1995 |
| WO | 2011055521 | 5/2011 |

* cited by examiner

*Primary Examiner* — Eliza W Osenbaugh-Stewart
(74) *Attorney, Agent, or Firm* — Adams & Wilks

(57) ABSTRACT

The focused ion beam apparatus includes: a vacuum container; an emitter tip disposed in the vacuum container and having a pointed front end; a gas field ion source; a focusing lens; a first deflector; a first aperture; an objective lens focusing the ion beam passing through the first deflector; and a sample stage. A signal generator responding to the ion beam in a point-shaped area is formed between the sample stage and an optical system including at least the focusing lens, the first aperture, the first deflector, and the objective lens, and a scanning field ion microscope image of the emitter tip is produced by matching a signal output from the signal generator and scanning of the ion beam by the first deflector with each other.

6 Claims, 9 Drawing Sheets

FOCUSED ION BEAM APPARATUS

CROSS REFERENCE TO RELATED APPLICATION(S)

This application claims the benefit of Korean Patent Application No. JP 2017-026264, filed Feb. 15, 2017, which is hereby incorporated by reference in its entirety into this application.

BACKGROUND OF THE INVENTION

1. Technical Field

The present invention relates to a focused ion beam apparatus including a gas field ion source that produces gas ions.

2. Description of the Related Art

In the related art, a focused ion beam apparatus has been known as an apparatus for observing, analyzing, or examining a sample such as a semiconductor device, or for producing a TEM sample by extracting a fine thin sample layer from a sample and then fixing the thin sample layer on a sample holder.

Such a focused ion beam apparatus includes an ion source that produces ions and radiates a focused ion beam (FIB) of the ions produced by the ion source.

There are various kinds of ion sources that are used for the focused ion beam apparatus, and for example, a plasma type ion source and a liquid metal ion source have been known, but a gas field ion source (GFIS) has been known as an ion source that can produce a focused ion beam having higher luminance and a smaller beam diameter, as compared with other ion sources (for example, see Patent Document 1).

Gas field ion sources generally include an emitter tip that has a front end pointed at an atomic level, a gas source that supplies gas such as helium (He) around the emitter tip, a cooler that cools the emitter tip, and an extraction electrode that is disposed away from the front end of the emitter tip.

According to this configuration, when gas is supplied, an extraction voltage is applied between the emitter tip and the extraction electrode, and the emitter tip is cooled, whereby the gas is ionized through field emission by a high electric field at the front end of the emitter tip, thereby producing gas ions. The gas ions repel from the emitter tip maintained at electrostatic potential, are extracted to the extraction electrode, and are then appropriately accelerated and focused, thereby producing a focused ion beam.

In particular, ions that are produced by a gas field ion source have high luminance, a small diameter, and low energy diffusion, as described above, so they can be radiated to a sample with a small beam diameter. Accordingly, high resolution can be achieved in observation or fine etching is possible.

In a focused ion beam apparatus using the gas field ion source, it is required to adjust the front end of the emitter tip in advance in order to stabilize an ion beam. Adjustment of the front end of an emitter tip is performed by installing a micro channel plate (MCP) at the rear end of a gas ion field source, forming a field ion microscope (FIM) image of the emitter tip, or forming a scanning FIM image using a deflector and an aperture installed in an FIB optical system (for example, see Patent Document 2).

PRIOR ART DOCUMENT

Patent Document (Patent Document 1) Japanese Patent Application Publication No. 7-240165
(Patent Document 2) International Patent Application Publication No. WO/2011/055521

SUMMARY OF THE INVENTION

However, for example, according to the configuration in which an aperture for forming a scanning FIM image is installed in an optical system, as in Patent Document 2, using a small aperture to shorten a radiation axis of an ion beam makes alignment difficult. Further, when a large aperture is used for easy alignment, the resolution of the scanning FIM image is deteriorated, so the front end of an emitter tip cannot be adjusted with high precision.

The present invention has been made in consideration of these problems and an object of the present invention is to provide a focused ion beam apparatus that can adjust the front end of an emitter tip with high precision without deteriorating the focusing characteristic or an alignment characteristic of an FIB optical system.

That is, a focused ion beam apparatus of the present invention has the following configuration.

The focused ion beam apparatus includes: a vacuum container; an emitter tip disposed in the vacuum container and having a pointed front end; a gas field ion source producing gas ions at the front end of the emitter tip; a focusing lens focusing an ion beam emitted from the gas field ion source; a first deflector deflecting the ion beam passing through the focusing lens; a first aperture disposed between the focusing lens and the first deflector and limiting the ion beam passing through the focusing lens; an objective lens focusing the ion beam passing through the first deflector, and a sample stage for placing an examination sample thereon, in which a signal generator responding to the ion beam in a point-shaped area is formed between the sample stage and an optical system including at least the focusing lens, the first aperture, the first deflector, and the objective lens, and a scanning field ion microscope image of the emitter tip is produced by matching a signal output from the signal generator and scanning of the ion beam by the first deflector with each other.

According to the focused ion beam apparatus, the signal generator corresponding in a point-shaped area is disposed outside the ion beam optical system, so it is possible to shorten the radiation axis (light path) of an ion beam, for example, as compared with the focused ion beam apparatus in which an MCP is disposed at the rear end of a gas field ion source to form an FIM image of an emitter tip. Accordingly, the amplitude of relative vibration of the emitter tip and the reference sample is reduced and it is possible to observe and adjust the emitter tip with high precision.

Further, according to the focused ion beam apparatus of the present invention, a signal generator that responds in a point-shaped area is disposed outside the ion beam optical system, so it is possible to install the large second aperture and easily perform alignment, as compared with the configuration in which a signal generator, for example, a second aperture is installed in an ion beam optical system that is limited in size in the related art.

Further, the signal generator 103 may be composed of a second aperture 36 disposed outside the ion beam optical system (optical system) 102, a Faraday cup or a channeltron disposed at the rear end of the second aperture 36, and the secondary particle detector (secondary electron detector) 11. In the embodiment illustrated in FIG. 1A, the secondary electron detector 11 (103) is disposed in the sample chamber 3 below the objective lens 8 and above the second aperture 36 (103), and secondary electrons generated at the second aperture 36 are detected by the secondary particle detector (secondary electron detector) 11, so an observation image light and darkness reversed can be obtained.

Further, according to the present invention, the signal generator may have a second aperture limiting the ion beam.

Further, according to the present invention, the apparatus may further include a second aperture controller inserting and removing the second aperture with respect to the radiation axis of the ion beam.

Further, according to the present invention, the signal generator may have a secondary electron detector that detects secondary electrons generated at the second aperture or secondary electrons generated when the ion beam travels into a reference sample disposed on the sample stage.

Further, according to the present invention, the signal generator may have an ammeter connected to the second aperture.

Further, according to the present invention, the signal generator may have a Faraday cup or a channeltron disposed at a rear end of the second aperture.

Further, according to the present invention, the ion beam may be scanned by the first deflector, and discharged secondary electrons may be detected by the secondary electron detector, thereby forming a scanning field ion microscope image.

According to the focused ion beam apparatus of the present invention, it is possible to adjust the front end of an emitter with high precision without deteriorating a focusing characteristic or an alignment characteristic of an FIB optical system.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF THE PREFERRED EMBODIMENTS

A focused ion beam apparatus that is an embodiment to which the present invention is applied is described hereafter with reference to the drawings. Embodiments to be described above are provided for detailed description to help understand the object of the present invention and do not limit the present invention unless specifically stated. Further, the drawings to be used in the following description may exaggerate main parts for convenience to make the characteristic clear and the dimensional ratios of the components are not necessarily the same as the actual dimensional ratios.

Focused Ion Beam Apparatus: First Embodiment

Figure 1:
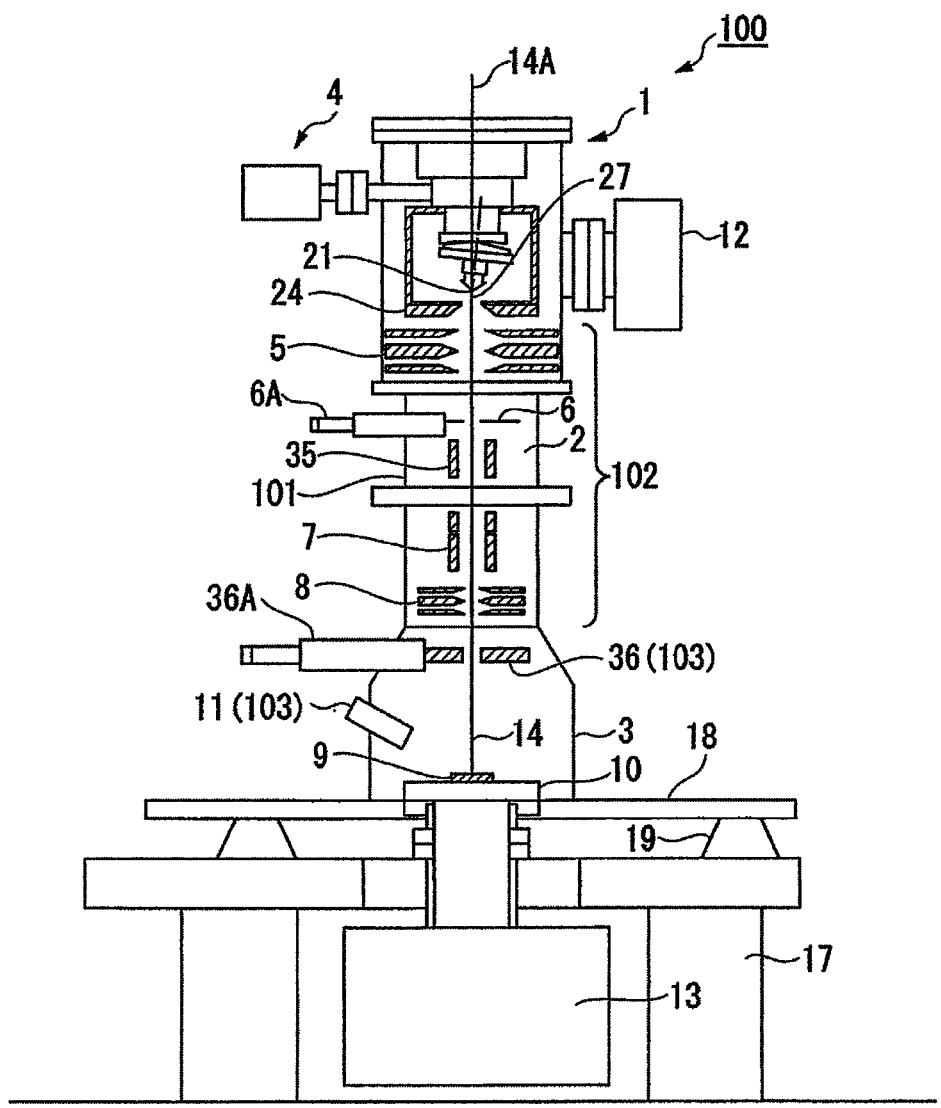
FIG. 1 is a view schematically showing the configuration of a scanning ion microscope that is an example of a focused ion beam apparatus according to a first embodiment of the present invention.
Figure 1A:
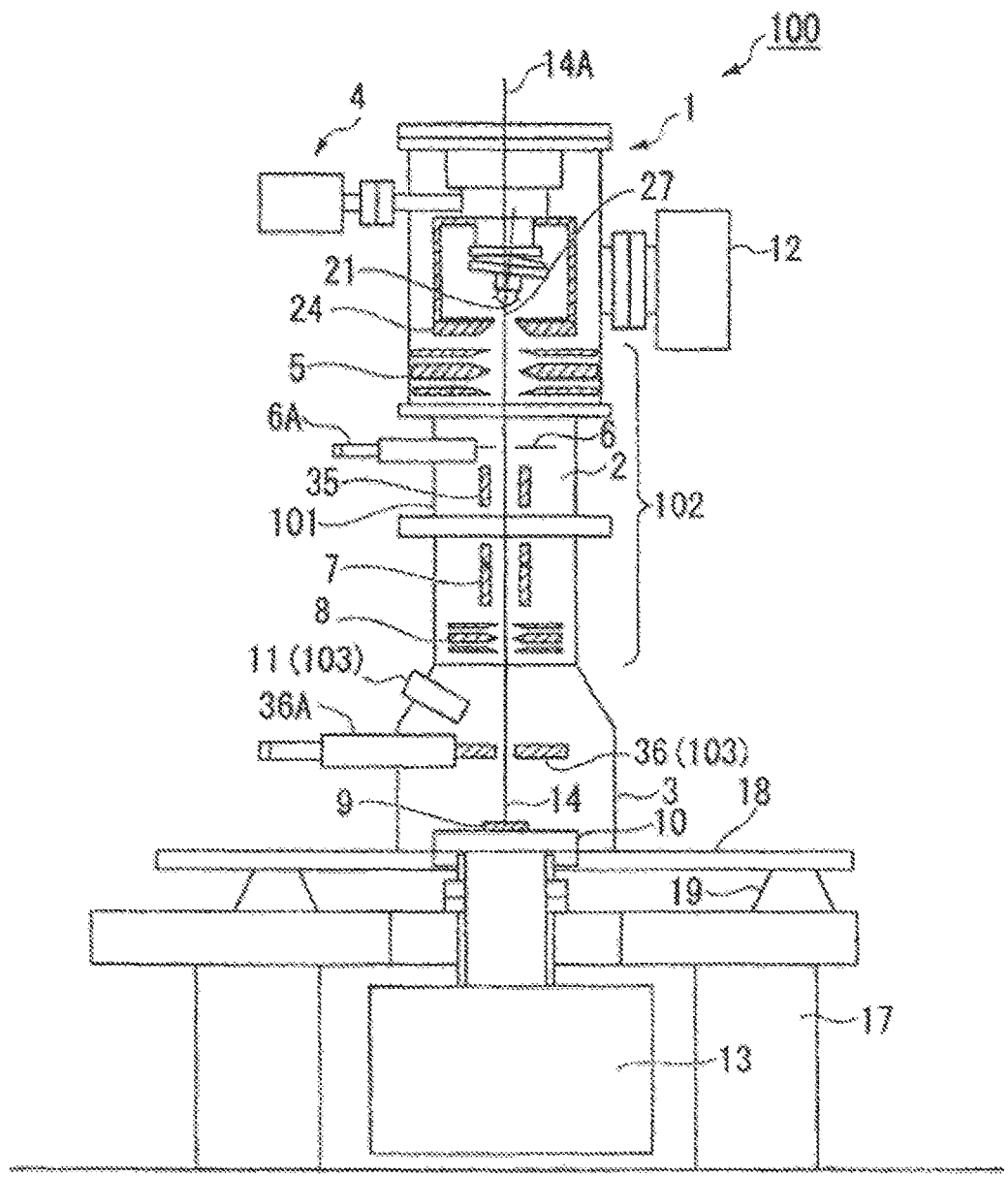
FIG. 1A is a view schematically showing a modified configuration of the scanning ion microscope shown in FIG. 1.

FIG. 1 is a view schematically showing the configuration of a scanning ion microscope that is an example of a focused ion beam apparatus according to an embodiment of the present invention.

A scanning ion microscope (focused ion beam apparatus) 100 includes a gas field ion source 1, an ion beam optical system column 2, a sample chamber 3, and a cooler 4. The gas field ion source 1, ion beam optical system column 2, and sample chamber 3 are disposed in a vacuum container 101.

The gas field ion source 1 has a needle-shaped emitter tip 21 and an extraction electrode 24 disposed opposite to the emitter tip 21 and having a hole 27 for passing ions. An ion beam optical system (optical system) 200 includes: a focusing lens 5 that focuses ions emitted from the gas field ion source 1; a first aperture 6 that limits an ion beam 14 passing through the focusing lens; a first deflector 35 that scans or aligns the ion beam 14 passing through the first aperture 6; a second deflector 7 that deflects the ion beam passing through the first deflector 35; and an objective lens 8 that focuses the ion beam passing through the second deflector 7 toward a sample 9 on a sample stage 10.

The first deflector 35 is a device that scans an ion beam to obtain an ion emission pattern from the emitter tip 21. A deflector shorter than the first deflector 35 in the optical axis direction may be further provided between the first deflector 35 and the focusing lens 5 to adjust a deflection axis.

In the sample chamber 3, the sample stage 10 to place the sample is formed and a signal generator 103 that responds to the ion beam 14 in a point image area is disposed between the ion beam optical system 102 and the sample stage 10. In this embodiment, for the signal generator 103, the second aperture 36 that limits the ion beam 14 and a secondary particle detector (secondary electron detector) 11 are provided.

The second aperture 36 can be inserted and removed with respect to a radiation axis 14A of the ion beam 14 outside the ion beam optical system (optical system) 102, for example, inside the sample chamber 3. That is, the second aperture 36 is removed from the radiation axis 14A of the ion beam 14 when an examination sample 9a that is used for common examination of the sample 9 is examined, and is inserted on the radiation axis 14A of the ion beam 14 when the front end of the emitter tip 21 is adjusted.

The ion beam 14 from the gas field ion source 1 is radiated to the sample 9 through the optical system 102. Secondary particles that come out of the sample 9 due to radiation of the ion beam 14 are detected by the secondary particle detector 11.

Though not shown, there may be provided an electron gun for neutralizing charge-up of a sample when an ion beam is radiated, or a gas gun for supplying etching or deposition gas around a sample.

The scanning ion microscope 100 includes an ion source evacuation pump 12 for evacuating the gas field ion source 1 and a sample chamber evacuation pump 13 for evacuating the sample chamber 3. A base plate 18 is disposed on an apparatus base 17 on the floor 20 with damping members 19 therebetween. The gas field ion source 1, ion beam optical system column 2, and sample chamber 3 are supported by the base plate 18.

The cooler 4 cools the inside of the gas filed ion source 1, the emitter tip 21, the extraction electrode 24 etc. For example, when a Gifford-McMahon (GM) cooler is used as the cooler 4, a compressor unit (compressor) (not shown) that uses helium gas as working gas is installed on the floor 20. Vibration of the compressor unit (compressor) is transmitted to the apparatus base 17 through the floor 20. The damping members 19 are disposed between the apparatus base 17 and the base plate 18, so high-frequency vibration from the floor 20 is difficult to be transmitted to the gas field ion source 1, ion beam optical system column 2, and sample chamber 3.

Figure 2:
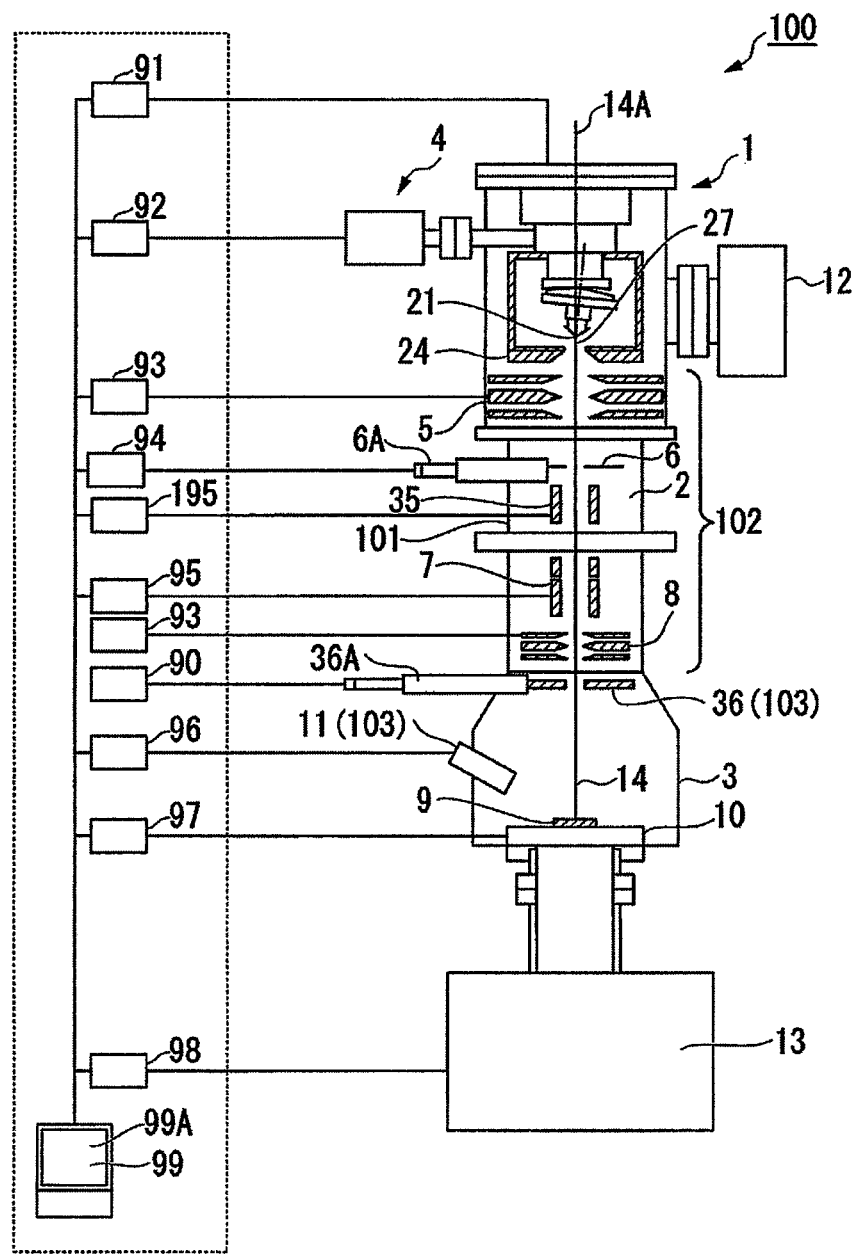
FIG. 2 is a view schematically showing the configuration of a control system of the scanning ion microscope shown in FIG. 1.

FIG. 2 is a view schematically showing the configuration of a control system of the scanning ion microscope shown in FIG. 1.

The control system of the scanning ion microscope (focused ion beam apparatus) 100 includes: a gas filed ion source controller 91 that controls the gas filed ion source 1; a cooler controller 92 that controls the cooler 40; a lens controller 93 that controls the focusing lens 5 and the objective lens 8; a first aperture controller 94 that controls a first aperture actuator 6A for actuating the first aperture 6; a first deflector controller 195 that controls the first deflector 35; a second deflector controller 95 that controls the second deflector 7; a second aperture controller 90 that controls a second aperture actuator 36A for actuating the second aperture 36; a secondary electron detector controller 96 that controls the secondary electron detector 11; a sample stage controller 97 that controls the sample stage 10; an evacuation pump controller 98 that controls the sample chamber evacuation pump 13; and a computing device that includes a calculator.

The computing device 99 includes a display 99A. The display 99A displays an image produced on the basis of a detection signal from the secondary particle detector 11 and information input through an input unit such as a keyboard.

The sample stage 10 includes a mechanism for moving straight the sample on the sample-placing surface in two perpendicular directions (X-direction and Y-direction), a mechanism for moving straight the sample 9 vertically from the sample-placing surface, and a mechanism for rotating the sample on the sample-placing surface. The sample stage 10 has an inclining function that can change the radiation angle of the ion beam 14 toward the sample 9 by rotating the sample 9 around an inclining axis. These mechanisms are controlled by the sample stage controller 97 in response to instructions from the computing device 99.

The scanning ion microscope (focused ion beam apparatus) 100 having this configuration according this embodiment is controlled by instructions from the computing device 99. The ion beam 14 produced by the gas field ion source 1 travels into the ion beam optical system (optical system) 102. Thereafter, the ion beam is focused by the focusing lens 5 of the ion beam optical system, is limited in beam diameter by the first aperture 6, and is then focused by the objective lens 8. The focused beam is radiated to a side of the examination sample 9a on the sample stage 10.

Secondary particles (secondary electrons) are emited by the examination sample 9a due the radiation of the focused beam. The secondary particles are detected by the secondary particle detector (secondary electron detector) 11. A signal from the secondary particle detector 11 undergoes luminance modulation and is then sent to the computing device 99. The computing device 99 produces a scanning ion microscope image and displays the image through the display 99A. Accordingly, it is possible to observe a side of the examination sample 9a with high resolution.

The first aperture 6 disposed in the ion beam optical system (optical system) 102 is moved in a plane substantially perpendicular to the radiation axis 14A of the ion beam, and a micro-ion beam 14 with less distortion can be obtained by aligning the hole of the first aperture 6 with the radiation axis 14A of the ion beam. Further, it is possible to select an opening angle of the ion beam 14 to the objective lens 8 by changing the size of the hole of the first aperture 6, or by preparing holes having different sizes, for example, a plurality of holes having different diameters, selecting the sizes of the hole or selecting a hole having a desired diameter, and passing the ion beam through the selected hole. Accordingly, it is possible to control the aberration of the objective lens 8, so it is possible to control an ion beam diameter and an ion beam current.

Figure 3:
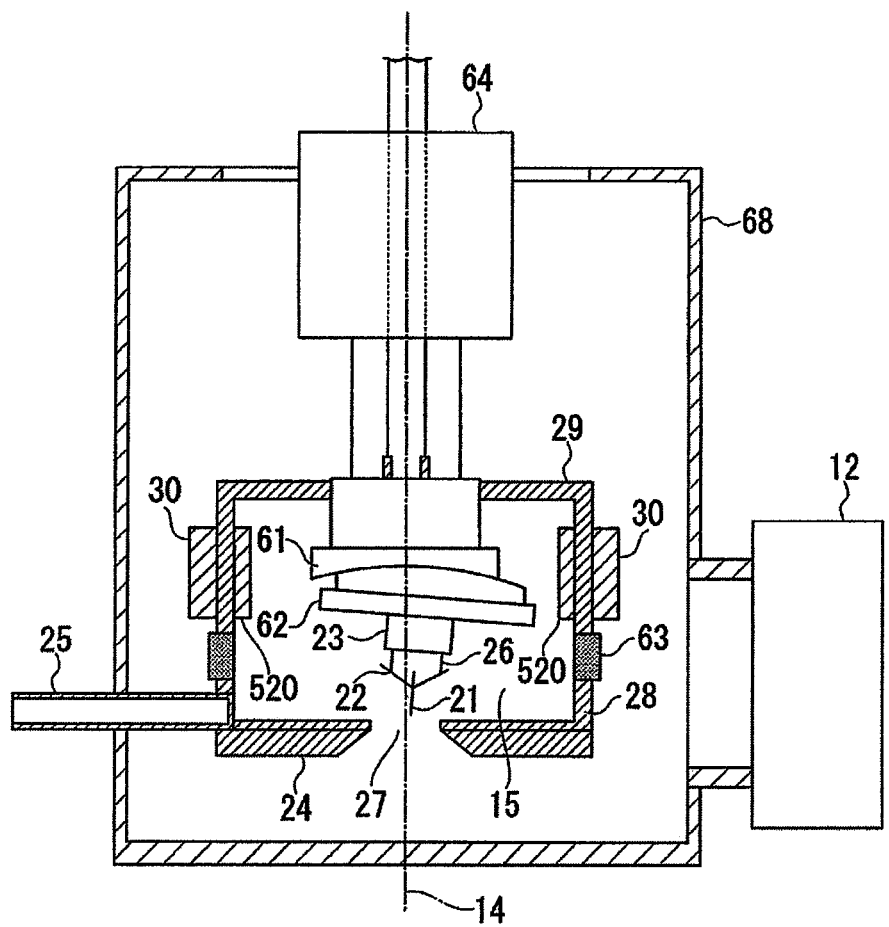
FIG. 3 is a view schematically showing the configuration of a gas field ion source.

The configuration of the gas field ion source 1 is described in more detail with reference to FIG. 3. FIG. 3 is a view schematically showing the configuration of a gas field ion source. The gas field ion source 1 includes the emitter tip 21, a pair of filaments 22, a filament mount 23, a support rod 26, and an emitter base mount 64. The emitter tip 21 is connected to the filaments 22. The filaments 22 are fixed to the support rod 26. The support rod 26 is supported by the filament mount 23. The filament mount 23 is fixed to an incliner 61, for example, which uses a piezoelectric element, and the emitter base mount 64 with an insulator 62 therebetween.

The gas field ion source 1 further has the extraction electrode 24, a cylindrical resistive heater 30, a cylindrical side 28, and a top plate 29. The extraction electrode 24 is disposed opposite to the emitter tip 21 and has a hole 27 for passing the ion beam 14. An insulator 63 is inserted in the side 28 to block high voltage that is applied to the extraction electrode.

The side 28 and the top plate 29 cover the emitter tip 21. A gas molecule ionization chamber 15 is formed by the extraction electrode 24, the side 28, the top plate 29, the insulator 63, and the filament mount 23. The gas molecule ionization chamber 15 is an area for increasing gas pressure around the emitter tip 21.

A gas supply pipe 25 is connected to the gas molecule ionization chamber 15. An ion material gas is supplied to the emitter tip 21 through the gas supply pipe 25. The ion material gas may be helium or hydrogen.

The gas molecule ionization chamber 15 is sealed except for the electrode hole 27 of the extraction electrode 24 and the gas supply pipe 25. The ion material gas supplied in the gas molecule ionization chamber 15 through the gas supply pipe 25 cannot leak through other portions except for the electrode hole 27 of the extraction electrode 24 and the gas supply pipe 25. By making the area of the hole 27 of the extraction electrode 24 sufficiently small, it is possible to keep the gas molecule ionization chamber 15 hermetically sealed.

For example, when the hole 27 of the extraction electrode 24 is a circle, the diameter is about 0.3 mm. Accordingly, when an ion material gas is supplied in to the gas molecule ionization chamber 15 through the gas supply pipe 25, the gas pressure in the gas molecule ionization chamber 15 becomes larger at least by one digit than the gas pressure in the vacuum container 101. Accordingly, the ratio of neutralization of the ion beam 14 due to hitting against gas is reduced and a high-current ion beam 14 can be produced.

The resistive heater 30 is used to degas the extraction electrode, the side 28 etc. Degassing the extraction electrode 24, the side 28 etc. is performed by heating. The resistive heater 30 is disposed outside the gas molecule ionization chamber 15. Accordingly, even if the resistive heater 30 is degassed, the degassing is performed outside the gas molecule ionization chamber 15, so high-vacuum state can be made inside the gas molecule ionization chamber 15.

Although the resistive heater 30 is used for degassing in this embodiment, a heating lamp may be used instead. A heating lamp can heat the extraction electrode 24 in a non-contact type, so the structure around the extraction electrode 24 can be simplified. Further, when a heating lamp is used, there is no need to apply high voltage, so the structure of the power of the heating lamp can be simplified.

Instead of using the resistive heater 30, it may be possible to heat the extraction electrode 24, the side 28 etc. by supplying high-temperature inactive gas through the gas supply pipe 25 for degassing. In this case, a gas heating device may be used as grounding potential. Further, it is possible to simplify the structure around the extraction electrode 24 without a wire and power.

By the sample chamber 3 and the resistive heater 30 on the sample chamber excavation pump 13, the sample chamber 3 and the sample chamber excavation pump 13 may be heated up to about 2000□ and the vacuum of the sample chamber 3 may be made $10^{-7}$ Pa or less. Accordingly, when the ion beam 14 is radiated to the sample 9, contaminations do not stick to the surface of the sample 9 and the surface of the sample 9 can be observed well. It is possible to observe the surface of the sample 9 with highest resolution by heating the sample chamber 3 and the sample chamber excavation pump 13 under vacuum and minimizing hydrocarbon-based remaining gas in the sample chamber 3.

In this embodiment, a nonvolatile getter material is used for the gas molecule ionization chamber 15. That is, a nonvolatile getter material 520 is applied to the wall that the ion material gas coming out of the gas supply pipe 25 hits against. Further, the heater 30 is disposed on the outer side of the gas molecule ionization chamber 15 and the nonvolatile getter material 520 is heated to be activated before the ion material gas is introduced. Further, the ion source is cooled to a very low temperature and then the ion material gas is supplied through the gas supply pipe 25. According to this configuration, the impure gas molecules that stick to the emitter tip 21 are remarkably reduced and the ion beam current is stabilized, so it is possible to observe sample without a luminance error.

Figure 4:
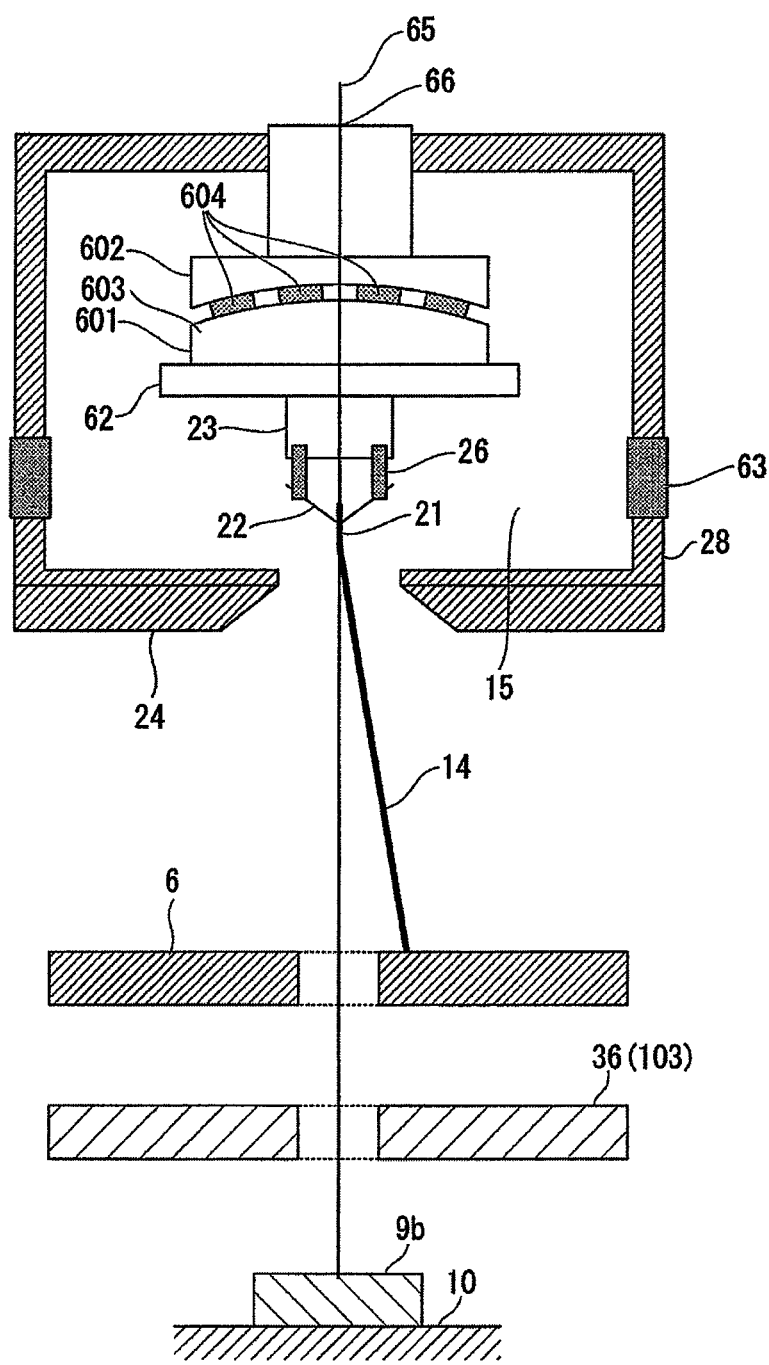
FIG. 4 is a view illustrating adjustment of an emitter tip.
Figure 5:
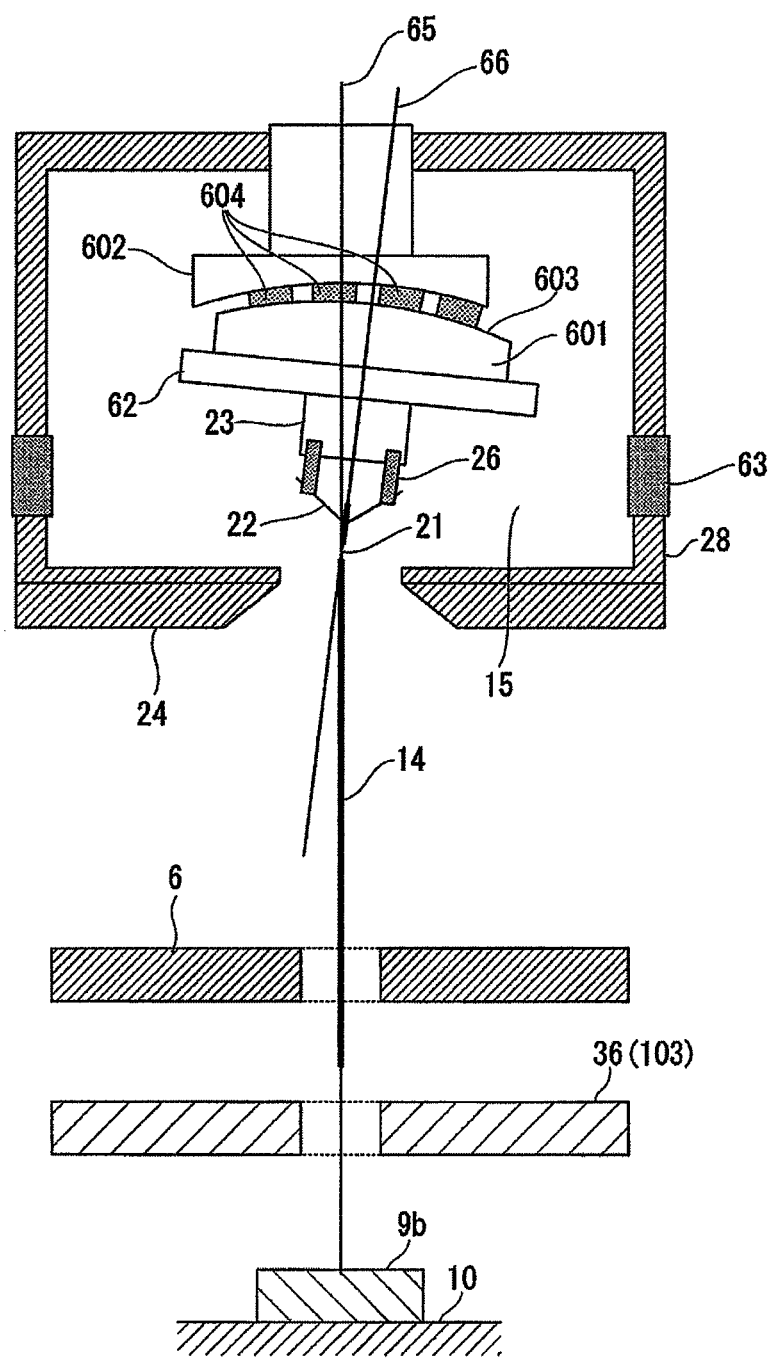
FIG. 5 is a view illustrating adjustment of an emitter tip.

FIGS. 4 and 5 are views illustrating adjustment of the emitter tip. The center line 66 passing through the filament mount 23 can be inclined with respect to a vertical line 65, that is, a center line 66 of the gas molecule ionization chamber 15. FIG. 4 shows the state in which the center line 66 passing through the filament mount 23 is not inclined with respect to the vertical line 65. FIG. 5 shows the state in which the center line 66 passing through the filament mount 23 is inclined with respect to the vertical line 65.

The filament mount 23 is fixed to the movable part 601 of the incliner. The movable part 601 is connected to a fixed part 602 with a sliding surface therebetween. The sliding surface 603 is a portion of a cylindrical or spherical surface formed with the emitter tip 21 at the center thereof and inclination can be controlled by controlling the sliding amount almost without moving the front end of the emitter tip 21. When the movement amount of the front end of the emitter tip 21 is about 0.5 mm, it does not matter. When the movement amount is within this range, it can be adjusted by deflectors.

When the sliding surface 603 is a portion of a cylindrical surface, the azimuth angle of an inclined surface can be controlled by controlling the rotational angle of the cylindrical surface about the radiation axis of the ion beam. When the sliding surface 603 is a portion of a spherical surface, the inclination can be controlled to a desired azimuth angle. The sliding surface of the incliner is a portion of a cylindrical surface or a spherical surface having the front end of the emitter tip 21 as the center thereof and is not a flat surface. Accordingly, the sliding surface can be made small and the gas field ion source can be down-sized by reducing the radius of the sliding surface from the front end of the emitter tip 21 to the cylindrical surface of the spherical surface.

In this embodiment, the moving part 601, fixed part 602, and the sliding surface 603 between the parts of the incliner are positioned in the ionization chamber and the radius of the sliding surface is smaller than the radius of the vacuum container of the ion source.

Piezoelectric elements 604 are arranged along a side, which is parallel with the sliding surface 603, of the fixed part 602 of the incliner and the sliding surface 603 is in contact with the piezoelectric elements 604. When a pulse-shaped voltage is applied to the piezoelectric element 604, the piezoelectric elements 604 can stretch and contract in one direction and the sliding surface 603 can be moved by friction.

Further, in order to generate an inclining force, other than by using piezoelectric elements as in this embodiment, it is also possible to use a rotary mechanism by combining gears connected to a motor or a push-pull mechanism implemented by a linear actuator.

For example, a tungsten wire of axial orientation <111> having a diameter of about 100~400 μm is used to make the pointed front end of the emitter tip 21. The radius of curvature of the front end of the emitter tip 21 is tens of nanometers. White gold is vacuum-deposited to the front end of the emitter tip 21, for example, by a vacuum deposition machine. Next, the atoms of the white gold are moved to the front end of the emitter tip 21 by heating at a high temperature. Accordingly, a pyramidal structure (hereafter, referred to as a nano-pyramid) is formed in a nanometer level by the atoms of white gold. The nano-pyramid of the emitter tip 21 usually has one atom at the front end, three or six atomic layers under the atom, and ten or more atomic layers under the layers.

In this embodiment, a thin tungsten wire is used as a parent material of the emitter tip 21, but other materials, such as a thin molybdenum wire may be used. Further, although a white gold coating is used, coatings of iridium, rhenium, osmium, palladium, and rhodium may be used.

When helium is used as an ion material gas, it is important that the evaporation strength of metal is larger than electric field strength where helium ionizes. Accordingly, coatings of white gold, rhenium, osmium, and iridium are particularly suitable. When hydrogen is used as the ion material gas, coatings of white gold, rhenium, osmium, palladium, rhodium, and iridium are suitable. Further, these coatings of metal can be formed by vacuum deposition, but may be formed by plating in a solution.

As another method of forming a nano-pyramid at the front end of the emitter tap 21, for example, field evaporation under vacuum and ion beam radiation may be used. According to these methods, it is possible to form a tungsten atom or a molybdenum atom nano-pyramid at the front end of a tungsten wire or a molybdenum wire. For example, when a tungsten wire <111> is used, it is possible to form a nano-pyramid composed of three tungsten atoms at the front end.

Further, it may be possible to form a nano-pyramid at the front ends of fine wires of white gold, iridium, rhenium, osmium, palladium, and rhodium, using etching under vacuum.

The emitter tip 21 is characterized by the nano-pyramid structure. By adjusting the field strength at the front end of the emitter tip 21, it is possible to produce helium ions around one atom of the front end of the emitter tip 21. Accordingly, the area where ions are discharged, that is, the ion source is very narrow at nanometers or less. As described above, by producing ions in a very limited area, it is possible to make the beam diameter of the ion beam 14 be 1 nm or less. Accordingly, the current value per unit area and unit solid angle of the ion source is increased. It is an important characteristic in obtaining a high-current ion beam having a fine diameter on the sample 9.

In particular, when white gold is deposited on tungsten, a nano-pyramid structure having one atom at the front end is stably formed. In this case, the positions where helium ions are produced are concentrated around one atom at the front end. When there are three atoms at the front end of tungsten <111>, the positions where helium ions are produced are dispersed around the three atoms.

Accordingly, an ion source having a nano-pyramid structure of white gold in which helium gas is concentrated around one atom is advantageous in increasing the current per unit area and unit solid angle. That is, depositing white gold to tungsten to form the emitter tip 21 is suitable for reducing the beam diameter of the ion beam 14 radiated to the sample 9 or increasing the current. Further, even though rhenium, osmium, iridium, palladium, rhodium etc. are used, when a nano-pyramid structure having one atom is formed at the front end, similarly, it is possible to make the current per unit area and unit solid angle large and it is suitable for reducing the beam diameter of the ion beam 14 radiated to the sample 9 or increasing the current.

Further, when the emitter tip 21 is sufficiently cooled and gas is sufficiently supplied, it is not necessary to make the front end with one atom, and even if there are three, seven, ten etc. atoms, it is possible to reduce the beam diameter of the ion beam 14 or increase the current.

In order to adjust the front end of the emitter tip 21, a reference sample 9b for adjusting the emitter tip is placed on the sample stage 10 and a first aperture 6 having a large hole is selected. For example, a first aperture 6 having a circular hole with a diameter of 3 mm is selected. That is, the ion beam 14 that has passed through the hole of a ring-shaped disc of the focusing lens 5 is allowed to pass through all holes of the first aperture 6.

The ion beam that has passed through the first aperture 6 passes through the first deflector 35, the second deflector 7, and the objective lens 8, and then comes out of the ion beam optical system (optical system) 102. Further, the ion beam passes through the hole of the second aperture 36 outside the ion beam optical system (optical system) 102, for example, in the sample chamber 3 and then reaches the reference sample 9b. The second aperture 36 limits the ion beam that has passed through the objective lens 8, thereby making it easy to obtain the emission pattern of the ion beam and improving resolution.

Further, secondary particles (secondary electrons) coming out of the reference sample 9b are detected by the secondary particle detector 11, as described above. A signal from the secondary particle detector 11 undergoes luminance modulation and is then sent to the computing device 99. The ion beam 14 is scanned by the first deflector 35. Accordingly, of the ion beam emitted from the emitter tip 21, only the ion beam that has passed through the second aperture 36 reaches the reference sample 9b.

Further, secondary particles (secondary electrons) coming out of the reference sample 9b due to radiation of the ion beam 14 are detected by the secondary particle detector 11. A signal from the secondary particle detector 11 undergoes luminance modulation and is then sent to the computing device 99.

Figure 6:
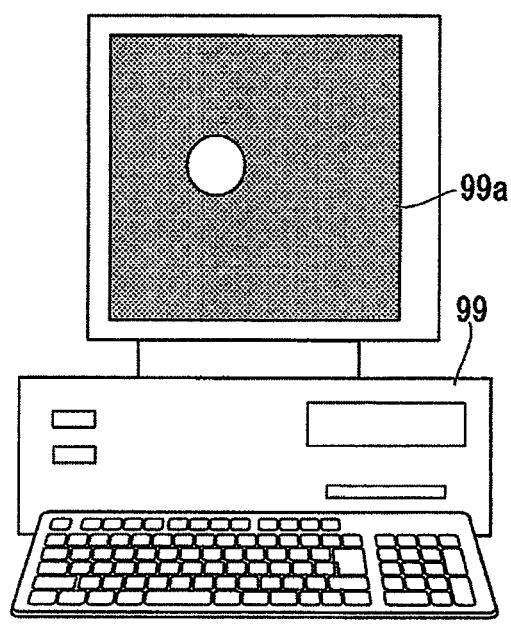
FIG. 6 is a schematic view showing an example of image information of an ion emission pattern when an emitter is adjusted.

When the front end of the emitter tip 21 is a nano-pyramid having one atom, one bright pattern can be obtained as an ion emission pattern on the display 99a of the computing device 99, as shown in FIG. 6. That is, the inclination of the emitter tip 21 is adjusted to the angle where the bright point can be obtained. With reference to the displayed ion beam emission pattern image, it is possible to adjust the inclination of the emitter tip 21 and align the ion beam 14 with the radiation axis.

Further, when almost the entire ion beam is obtained from only one atom at the front end of the emitter tip 21, gas supply is concentrated on the atom, and particularly, an ion source having high luminance is achieved, as compared with cases having three or more atoms. When there is one atom at the front end of the emitter tip 21, it is not required to block ion emission from other atoms at the second aperture 36 and there is no need to select an atom from an ion emission pattern.

Further, the ion beam 14 that has passed through the first aperture 6 is scanned and secondary electrons are detected by the secondary particle detector (secondary electron detector) 11, whereby a scanning field ion microscope image may be formed as an ion emission pattern.

According to this order, an ion emission pattern from the emitter tip 21 can be obtained. Further, on the basis of the ion emission pattern, it is possible to adjust the inclination of the emitter tip 21 and align the ion beam with a light axis.

Further, according to the scanning ion microscope (focused ion beam apparatus) 100 of the present invention, since the second aperture 36 constituting a signal generator 103 that responds in a point-shaped area is disposed outside the ion beam optical system (optical system), for example, in the sample chamber 3, it is possible to shorten a radiation axis (light path) of the ion beam, as compared with, for example, a focused ion beam apparatus of the related art in which an MCP is disposed at the rear end of a gas field ion source to form an FIM image of an emitter tip. Therefore, the amplitude of relative vibration of the emitter tip 21 and the reference sample 9b is reduced and it is possible to observe and adjust the emitter tip 21 with high precision.

Further, according to the scanning ion microscope (focused ion beam apparatus) 100 of the present invention, since the second aperture 36 constituting a signal generator 103 that responds in a point-shaped area is disposed outside the ion beam optical system (optical system), for example, in the sample chamber 3, it is possible to install the large second aperture 36 and easily perform alignment, as compared with the configuration in which a second aperture is installed in an ion beam optical system that is limited in size in the related art.

Further, since the second aperture 36 can be removed from the radiation axis 14A of the ion beam by operating the second aperture controller 90 when the examination sample 9a is observed, it is possible to efficiently observe the examination sample 9a.

When the front end of the emitter tip 21 is a nano-pyramid composed of a plurality atoms, for example, six atoms, the second aperture 36 can allow ion beams from the atoms of the emitter tip 21 to separately reach the reference sample 9b, as long as the area or the diameter of an ion beam emitted from one atom at the front end of the emitter tip 21 is larger at least in the closing width than the area or the diameter of the hole of the second aperture 36.

Figure 7:
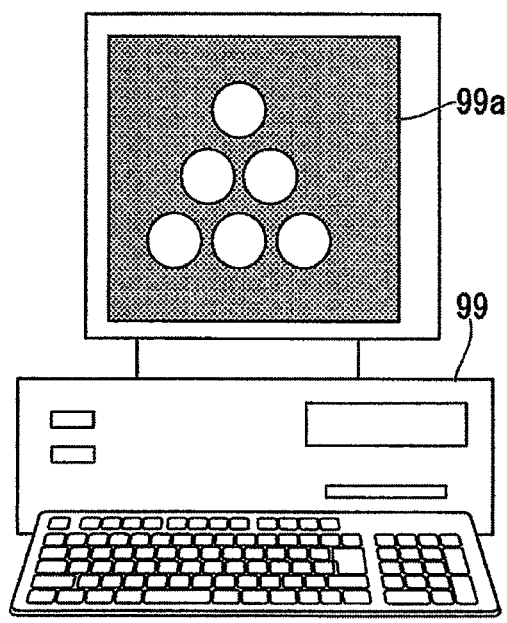
FIG. 7 is a schematic view showing an example of image information of an ion emission pattern when an emitter is adjusted.

This means that it is possible to observe an ion emission pattern from the emitter tip 21 by scanning the ion beam 14 using the first deflector 35. Further, the ion emission pattern, as shown in FIG. 7, is displayed on the image display 99A of the computing device 99. A user adjusts the angle of the emitter tip 21 while observing the ion emission pattern.

That is, by selecting a desired one bright spot or several bright spots from six bright spots in the ion emission pattern, the angle of the emitter tip 21 is adjusted such that the bright spots reach the reference sample 9b. Further, from an ion emission pattern, not only six patterns shown in FIG. 6, but, commonly, three, tea, fifteen or more atomic patterns can be obtained. In particular, when ions are emitted from four to fifteen atoms at the front end of the emitter tip 21, the current is lower than the case with one to three atoms, but the ion current is stable and the lifespan of the gas field ion source 1 can be increased.

Further, the image information of the ion emission pattern may not be displayed, but be stored in the calculator of the computing device 99, and for example, it may be possible to analyze the image of the ion emission pattern and adjust the position and angle of the emitter tip 21 or adjust the voltage of the first deflector 35 on the basis of the analysis result.

Focused Ion Beam Apparatus: Second Embodiment

Figure 8:
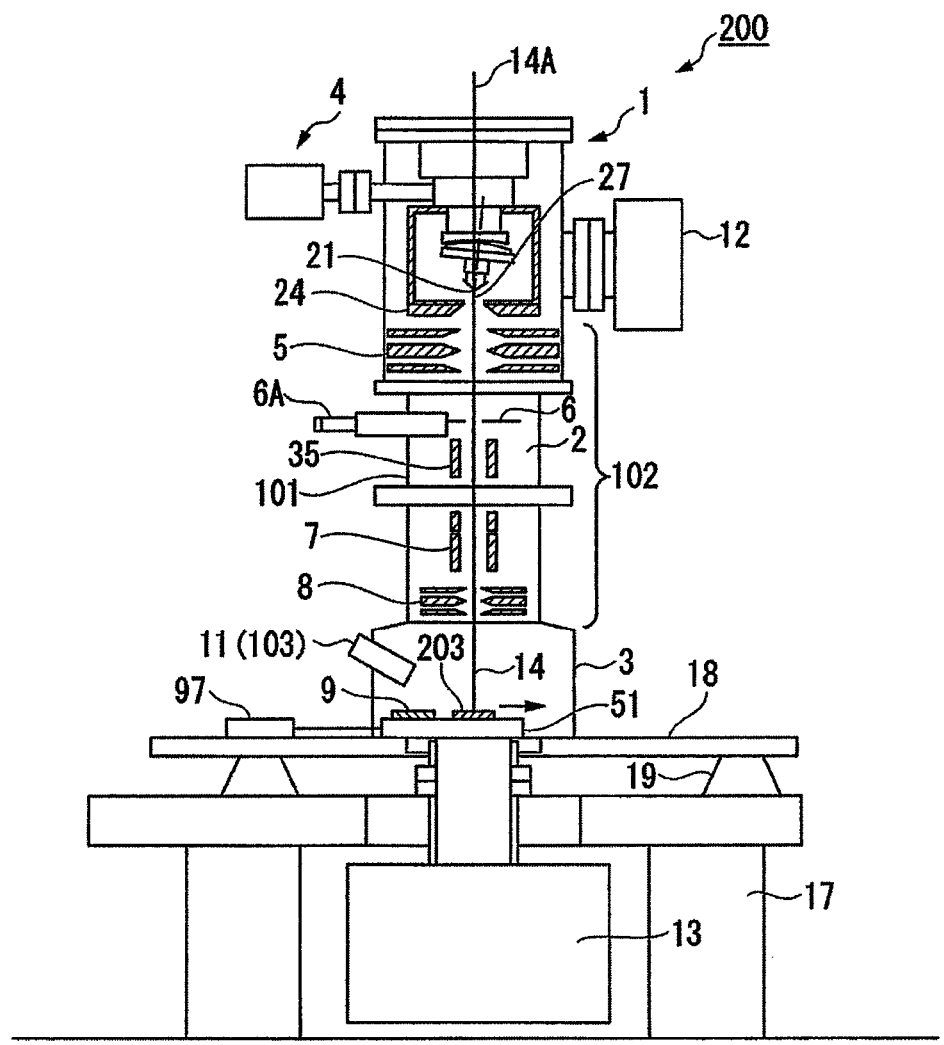
FIG. 8 is a view schematically showing the configuration of a scanning ion microscope that is an example of a focused ion beam apparatus according to a second embodiment of the present invention.

FIG. 8 is a view schematically showing the configuration of a scanning ion microscope that is another example of a focused ion beam apparatus according to an embodiment of the present invention. In the following description, same components as those in the first embodiment are given the same reference numeral and detailed description is not provided.

A scanning ion microscope (focused ion beam apparatus) 200 of this embodiment includes a gas field ion source 1, an ion beam optical system column 2, a sample chamber 3, and a cooler 4. The gas field ion source 1, ion beam optical system column 2, and sample chamber 3 are disposed in a vacuum container 101.

The gas field ion source 1 has a needle-shaped emitter tip 21 and an extraction electrode 24 disposed opposite to the emitter tip 21 and having a hole 27 for passing ions. An ion beam optical system (optical system) 200 includes: a focusing lens 5 that focuses ions emitted from the gas field ion source 1; a first aperture 6 that limits an ion beam 14 passing through the focusing lens; a first deflector 35 that scans or aligns the ion beam 14 passing through the first aperture 6; a second deflector 7 that deflects the ion beam passing through the first deflector 35; and an objective lens 8 that focuses the ion beam passing through the second deflector 7 toward a sample 9 on a sample stage 10.

A sample stage 51 an which the sample 9 can be placed is formed in the sample chamber 3. A signal generator 203 that responds to the ion beam 14 in a point-shaped area is formed at an end of the sample stage 51.

The sample stage 10 includes a mechanism for moving straight the sample on the sample-placing surface in two perpendicular directions (X-direction and Y-direction), a mechanism for moving straight the sample 9 vertically from the sample-placing surface, and a mechanism for rotating the sample on the sample-placing surface. The sample stage 51 has an inclining function that can change the radiation angle of the ion beam 14 toward the sample 9 by rotating the sample 9 around an inclining axis. These mechanisms are controlled by a sample stage controller 97.

Further, the sample stage 51 can be moved much in at least one of two perpendicular direction (X-direction and Y-direction) and can be moved between an insertion position where the signal generator 203 at an end of the sample stage 51 is inserted on a radiation axis 14A of the ion beam 14 and a removal position where the signal generator 203 is removed from the radiation axis 14A of the ion beam 14.

In the focused ion beam apparatus 200, a signal output from the signal generator 203 and scanning of the ion beam 14 by the first deflector 35 are matched, and a scanning field ion microscope image of the emitter tip 21 is produced.

Further, according to the scanning ion microscope (focused ion beam) 200 of this embodiment, when a sample 9 that is used for normal examination is examined, the sample stage 51 is moved, thereby removing the signal generator 203 from the radiation axis 14A of the ion beam 14. However, when the front end of the emitter tip 21 is adjusted, the sample stage 51 is moved, thereby inserting the signal generator on the radiation axis 14A of the ion beam 14 and then the front end of the emitter tip 21 is adjusted.

According to the scanning ion microscope (focused ion beam) 200 of the second embodiment, for example, as compared with the scanning ion microscope 100 of the first embodiment, there is no second aperture, so the ion beam optical system (optical system) 102 and the sample sage 51 can be positioned close to each other. Accordingly, when the sample 9 that is used for common examination is examined, the operation distance of the objective lens 8 is reduced and the ability to focus the ion beam 14 is increased.

Focused Ion Beam Apparatus: Other Embodiment

In the scanning ion microscope (focused ion beam apparatus) 100 according to the previous embodiment, as the signal generator 103 responding to an ion beam in a point-shaped area, the second aperture 36 that limits the ion beam 14 and the secondary particle detector (secondary electron detector) 11 are used, but the signal generator 103 may be composed of, for example, a second aperture 36 disposed outside the ion beam optical system (optical system) 102 and an ammeter connected to the second aperture 36 may be used.

Further, the signal generator 103 may be composed of a second aperture 36 disposed outside the ion beam optical system (optical system) 102, a Faraday cup or a channeltron disposed at the rear end of the second aperture 36 instead of a secondary particle detector, and an ammeter connected to the Faraday cup or the channeltron. The Faraday cup is formed in a cup shape made of conductive material to catch charged particles.

Further, the signal generator 103 may be composed of a second aperture 36 disposed outside the ion beam optical system (optical system) 102, a Faraday cup or a channeltron disposed at the rear end of the second aperture 36, and the secondary particle detector (secondary electron detector) 11. In this configuration, secondary electrons generated at the second aperture are detected by the secondary particle detector (secondary electron detector) 11, so an observation image light and darkness reversed can be obtained.

Further, the signal generator 103 may be composed of a second aperture 36 disposed outside the ion beam optical system (optical system) 102, a fluorescent plate disposed at the rear end of the second aperture 36, and a fluorescent detector disposed at the rear end of the fluorescent plate instead of a secondary particle detector.

Further, the signal generator 130 may be composed of an MCP (Multi-Channel Plate) disposed outside the ion beam optical system (optical system) instead of the second aperture 36, and an ammeter connected to the multi-channel plate. The MCP is an insulating substrate, for example, a glass plate with a hole (microchannel) formed at an angle through a side to the other side. According to the MCP, secondary electrons are amplified by an avalanche effect by coming in contact with a side of a secondary electron channel discharged when charged particles travel inside, and an electrode is disposed on an emission side and is detected by an ammeter.

Although some embodiments of the present invention were described above, the embodiments are provides just example and do not limit the scope of the present invention. The embodiments may be achieved in other various embodiments and the present invention may be changed, replaced, and modified in various ways without departing from the scope of the present invention. If the embodiments and modifications are included in the scope or the spirit of the invention, they are included in the equivalent range of the present invention described in claims.

What is claimed is:

1. A focused ion beam apparatus, comprising:
a vacuum container;
an emitter tip disposed in the vacuum container and having a pointed front end;
a gas field ion source for producing gas ions at the front end of the emitter tip;
a focusing lens for focusing an ion beam emitted from the gas field ion source;
a first deflector for deflecting the ion beam passing through the focusing lens;
a first aperture disposed between the focusing lens and the first deflector for limiting the ion beam passing through the focusing lens;
an objective lens for focusing the ion beam passing through the first deflector; and
a sample stage for holding an examination sample thereon, wherein
a signal generator which responds to the ion beam in a point-shaped area is provided between the sample stage and an optical system that includes at least the focusing lens, the first aperture, the first deflector, and the objective lens,
a scanning field ion microscope image of the emitter tip is produced by matching a signal output from the signal generator and scanning of the ion beam by the first deflector with each other,
the signal generator has a second aperture for limiting the ion beam, the second aperture being located outside the optical system, and
the focused ion beam apparatus further comprises an aperture controller for moving the second aperture so as to be inserted or removed with respect to a radiation axis of the ion beam.

2. The apparatus of claim 1, wherein the signal generator has a secondary electron detector that detects secondary electrons generated at the second aperture or secondary electrons generated when the ion beam is radiated to a reference sample disposed on the sample stage.

3. The apparatus of claim 2, wherein the ion beam is scanned by the first deflector, and discharged secondary electrons are detected by the secondary electron detector, thereby forming a scanning field ion microscope image.

4. A focused ion beam apparatus, comprising:
a vacuum container;
an emitter tip disposed in the vacuum container and having a pointed front end;
a gas field ion source for producing gas ions at the front end of the emitter tip;
a focusing lens for focusing an ion beam emitted from the gas field ion source;
a first deflector for deflecting the ion beam passing through the focusing lens;
a first aperture disposed between the focusing lens and the first deflector for limiting the ion beam passing through the focusing lens;
an objective lens for focusing the ion beam passing through the first deflector; and
a sample stage for holding an examination sample thereon,
wherein a signal generator which responds to the ion beam in a point-shaped area is disposed on the sample stage so as to be able to be inserted and removed with respect to a radiation axis of the ion beam and
a scanning field ion microscope image of the emitter tip is produced by matching a signal output from the signal generator and scanning of the ion beam by the first deflector with each other.

5. The apparatus of claim 4, wherein the signal generator has a secondary electron detector that detects secondary electrons generated at the signal generator disposed on the sample stage.

6. The apparatus of claim 5, wherein the ion beam is scanned by the first deflector, and discharged secondary electrons are detected by the secondary electron detector, thereby forming a scanning field ion microscope image.

* * * * *